US010295633B2

(12) United States Patent
Duijndam

(10) Patent No.: US 10,295,633 B2
(45) Date of Patent: May 21, 2019

(54) DIXON MAGNETIC RESONANCE IMAGING USING PRIOR KNOWLEDGE

(71) Applicant: KONINKLIJKE PHILIPS N.V., Eindhoven (NL)

(72) Inventor: Adrianus Joseph Willibrordus Duijndam, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 87 days.

(21) Appl. No.: 15/529,255

(22) PCT Filed: Nov. 30, 2015

(86) PCT No.: PCT/EP2015/077993
§ 371 (c)(1),
(2) Date: May 24, 2017

(87) PCT Pub. No.: WO2016/087336
PCT Pub. Date: Jun. 9, 2016

(65) Prior Publication Data
US 2017/0261580 A1 Sep. 14, 2017

(30) Foreign Application Priority Data
Dec. 4, 2014 (EP) .................................... 14196357

(51) Int. Cl.
*G01V 3/00* (2006.01)
*G01R 33/48* (2006.01)
(Continued)

(52) U.S. Cl.
CPC ..... *G01R 33/4828* (2013.01); *G01R 33/5608* (2013.01); *G01R 33/4835* (2013.01)

(58) Field of Classification Search
CPC .......... G01R 33/4828; G01R 33/56563; G01R 33/243; G01R 33/5608; G01R 33/443;
(Continued)

(56) References Cited

U.S. PATENT DOCUMENTS 7,151,370 B1 * 12/2006 Hargreaves ........ G01R 33/4828
324/307
2004/0010191 A1 * 1/2004 Yatsui .................. A61B 5/4872
600/410
(Continued)

FOREIGN PATENT DOCUMENTS

WO WO-2016116545 A1 * 7/2016 ............. A61B 5/055

OTHER PUBLICATIONS

Bernstein et al "Handbook of MRI Pulse Sequences" Elsevier Academic Press 2004, p. 857-887.
(Continued)

*Primary Examiner* — Rodney E Fuller

(57) ABSTRACT

The invention provides for a magnetic resonance imaging system (100) for acquiring magnetic resonance data (142) from a subject (118). The magnetic resonance imaging system comprises a processor (130) for controlling the magnetic resonance imaging system. The execution of the instructions causes the processor to control (200) the magnetic resonance imaging system with the pulse sequence data to acquire the magnetic resonance data. The pulse sequence data comprises commands for acquiring the magnetic resonance data using an n point Dixon magnetic resonance imaging method. The execution of the instructions causes the processor to construct (202) two phase candidate maps (144, 146) using the magnetic resonance data according to the n point Dixon magnetic resonance imaging method; divide (204) each of the set of voxels into a set of object voxels (148); identify (206) a set of boundary voxels (152) and interior voxels within the set of object
(Continued)

voxels; create (208) a chosen phase candidate map (154) in the memory; select (210) a chosen phase map value for at least a portion of the set of boundary voxels in the chosen phase map from the two phase candidate maps by selecting the candidate phase map value which indicates the lowest fat to water ratio; and calculate (212) the phase map value of the object voxels according to a phase candidate selection algorithm.

14 Claims, 8 Drawing Sheets

(51) Int. Cl.
*G01R 33/56* (2006.01)
*G01R 33/483* (2006.01)

(58) Field of Classification Search
CPC ............ G01R 33/288; G01R 33/543; G01R 33/5607; G01R 33/246; G01R 33/50; G01R 33/54; G01R 33/5616; A61B 5/055
USPC .......................................................... 324/309
See application file for complete search history.

(56) References Cited

U.S. PATENT DOCUMENTS

| | | | | |
|---|---|---|---|---|
| 2010/0052674 A1* | 3/2010 | Jellus | ............... | A61B 6/037 324/309 |
| 2010/0123460 A1* | 5/2010 | Hughes | ............... | A61B 5/055 324/309 |
| 2010/0283463 A1* | 11/2010 | Lu | ............... | G01R 33/243 324/309 |
| 2011/0140696 A1 | 6/2011 | Yu | | |
| 2011/0199082 A1* | 8/2011 | Kimura | ............... | A61B 5/0263 324/306 |
| 2011/0254547 A1 | 10/2011 | Reeder et al. | | |
| 2013/0214781 A1 | 8/2013 | Hernando et al. | | |
| 2013/0249551 A1* | 9/2013 | Kuehn | ............... | G01R 33/44 324/309 |
| 2016/0161584 A1* | 6/2016 | Fautz | ............... | A61B 5/055 324/309 |
| 2017/0038446 A1* | 2/2017 | Liu | ............... | A61B 5/4872 |
| 2018/0011158 A1* | 1/2018 | Katscher | ............... | A61B 5/055 |
| 2018/0259607 A1* | 9/2018 | Liu | ............... | G01R 33/5607 |

OTHER PUBLICATIONS

Xiang "Two Point Water-Fat Imaging With Partially-Opposed Phase (POP) Acquisiton . . . " Magnetic Resonance in Medicine vol. 56, p. 572-584 (2006).

Berglund et al "Two Point Dixon Method With Flexible Echo Times" Magnetic Resonance in Medicine, vol. 65, p. 994-1004 (2011).

Kolmogorov "Convergent Tree-Reweighted Message Passing for Energy Minimization" IEEE Transactions on Pattern Analysis and Machine Intellegence, vol. 28, No. 10 Oct. 2006 p. 1568-1583.

Fangping Huang et al: "A Fast Iterated Conditional Modes Algorithm for Water Fat Decomposition in MRI", IEEE Transactions on Medical Imaging, IEEE Service Center, Piscataway, NJ, US,vol. 30, No. 8, Aug. 1, 2011 (Aug. 1, 2011),pp. 1480-1492.

Samir D. Sharma et al: "Improving chemical shift encoded water-fat separation using object-based information of the magnetic field inhomogeneity",Magnetic Resonance in Medicine,vol. 73, No. 2,Feb. 28, 2014 (Feb. 28, 2014), pp. 597-604.

Jingfei Ma: "Breath-hold water and fat imaging using a dual-echo two-point dixon technique with an efficient and robust phase-correction algorithm",Magnetic Resonance in Medicine,vol. 52, No. 2, Jul. 23, 2004 (Jul. 23, 2004), pp. 415-419.

K.L. Weiss et al: "Subminute Fat-Water-Separated Dual-Echo Automated Spine Survey Iterative Scan Technique", AJNR, American Journal of Neuroradiology, vol. 30, No. 10, May 27, 2009 (May 27, 2009), pp. 1840-1846.

* cited by examiner

DIXON MAGNETIC RESONANCE IMAGING USING PRIOR KNOWLEDGE

CROSS REFERENCE TO RELATED APPLICATIONS

This application is a U.S. national phase application of International Application No. PCT/EP2015/077993, filed on Nov. 30, 2015, which claims the benefit of EP Application Serial No. 14196357.9 filed on Dec. 4, 2014 and is incorporated herein by reference.

TECHNICAL FIELD OF THE INVENTION

The invention related to magnetic resonance imaging, in particular to Dixon methods of magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

MRI scanners are able to construct images of either slices or volumes. A slice is a thin volume that is only one voxel thick. A voxel is a small volume over which the MRI signal is averaged, and represents the resolution of the MRI image. A voxel may also be referred to as a pixel herein.

Dixon methods of magnetic resonance imaging include a family of techniques for producing separate water and lipid (fat) images. The various Dixon techniques such as, but not limited to, two-point Dixon Method, three-point Dixon method, four-point Dixon method, and six-point Dixon Method are collectively referred to herein as Dixon techniques or methods. The terminology to describe the Dixon technique is well known and has been the subject of many review articles and is present in standard texts on Magnetic Resonance Imaging. For example "Handbook of MRI Pulse Sequences" by Bernstein et. al., published by Elsevier Academic Press in 2004 contains a review of some Dixon techniques on pages 857 to 887.

The journal article Xiang, "Two-Point Water-Fat Imaging With Partially-Opposed-Phase (POP) Acquisition: An Asymmetric Dixon Method," Magnetic Resonance in Medicine, 56:572-584 (2006) discloses a Dixon method where water and fat magnetization vectors are sampled at partially-opposed-phase instead of being exactly antiparallel.

The journal article Berglund et al., "Two-point Dixon Method With Flexible Echo Times," Magnetic Resonance in Medicine, 65:994-1004 (2011) discloses a Dixon method where a water-only and a fat-only image are produced from a dual-echo acquisition." The US patent application US2011/0254547 concerns a method of magnetic resonance imaging that involves water-fat separation. A weighting map that represents the likelihood that one chemical species is depicted as another (water-fat swap) and a weighting map that characterises the smoothness of field map variations are utilised to achieve a robust water-fat separation.

SUMMARY OF THE INVENTION

The invention provides for a magnetic resonance imaging system, a computer program product and a method in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor.

'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data from a subject within an imaging zone. The magnetic resonance imaging system comprises a memory for storing machine-executable instructions and also for storing pulse sequence data. Pulse sequence data as used herein encompasses data that may be used to control the magnetic resonance imaging system to acquire the magnetic resonance data according to a particular magnetic resonance imaging protocol. The pulse sequence data may for instance be in the form of commands which may be executed or it may be in the form of a timing diagram or timing information which may be converted by a program into commands for controlling the magnetic resonance imaging system. The pulse sequence data comprises commands for acquiring the magnetic resonance data using an n point Dixon magnetic resonance imaging method. n is greater than or equal to 2. The review of common Dixon techniques may for instance be found in the Handbook of MRI Pulse Sequences by Bernstein et al. (See pages 857-887).

The magnetic resonance imaging system further comprises a processor for controlling the magnetic resonance imaging system. Execution of the instructions causes the processor to control the magnetic resonance imaging system with the pulse sequence data to acquire the magnetic resonance data. In this step the executable instructions cause the processor to execute the pulse sequence data and the pulse sequence data is acquired according to the n point Dixon magnetic resonance imaging method. Next execution of the machine-executable instructions causes the processor to construct two phase candidate maps using the magnetic resonance data according to the n point Dixon magnetic resonance imaging method. When performing a Dixon method, commonly two phase candidate maps are constructed because there are multiple solutions to the Dixon equations. The phase candidate maps may also be referred to as "phase maps" or "B0 maps." To solve the equations correctly the two phase candidate maps are constructed and later in the algorithm, as is described below, the correct phase candidate for each voxel is selected. Each of the two phase candidate maps are in image space. Each of the two phase candidate maps also comprises a set of voxels. The two phase candidate maps with the sets of voxels contain solutions to the Dixon equations, where each of the two solutions has a corresponding fat to water ratio. In each of the two phase candidate maps each voxel has a phase map value. The two phase candidate maps may also be referred to as field map candidates.

In the Dixon method, a model for the measured signal is formulated in the image domain. The complex composite signal in image space $s_m$, sampled at echo times $t_m$ with $m=0 \ldots M-1$, is modeled by:

$$s_m = \left( w + f \sum_{n=1}^{N_p} w_n e^{j2\pi \Delta f_n t_m} \right) e^{j2\pi \Delta f_0 t_m} e^{j\phi_m}, \quad (0.1)$$

where w and f are the complex water and fat signals at echo time $t_m=0$, $\Delta f_0$ represents the B0 field and the extra phase factor $\phi_m$ represents an extra phase error which may be due to eddy currents or other effects. For Dixon methods with more than 2 echoes the term $\Delta f_0$ strictly represents the frequency corresponding to the deviation of the main magnetic field from its nominal value. The spatial distribution of the deviation is often referred to as "field map". The phrase "phase term" in the invention in this case refers to the corresponding phase difference between subsequent echoes: $2\pi\Delta f_0 \Delta t$, with $\Delta t$ the difference in echo time between subsequent echoes.

For 2 point Dixon the model above can also be written as:

$$s_0 = \left( w + f \sum_{n=1}^{N_p} w_n e^{j2\pi \Delta f_n t_0} \right) e^{j\phi_0} \quad (0.2)$$

$$s_1 = \left( w + f \sum_{n=1}^{N_p} w_n e^{j2\pi \Delta f_n t_1} \right) e^{j\phi_1},$$

where the phase terms $\phi_{0,1}$ now represent combined phase terms, containing phases due to the B0 field as well as phases due to eddy currents. In processing of Dixon data, the term "phase term" now refers to the phase difference between the two echoes: $\phi_1-\phi_0$. The difference with the formulation above for 3 or more echoes, is that this phase difference is also due to eddy currents. Apart from that, the meaning is identical. In equation 0.2, relaxation is ignored. Relaxation is however typically not ignored in n point Dixon methods where n is greater than or equal to 3.

Execution of the machine-executable instructions further cause the processor to divide each of the set of voxels into a set of object voxels and a set of background voxels using an object identification algorithm. In this step the voxels in each of the phase candidate maps are divided into being an object voxel, which is considered to be a voxel which is an image of the subject or one of a set of background voxels. The background voxels are voxels which are regions which do not contain the subject. Various types of object identification algorithms may be used. For example the strength of the signal may be used for example if there is nothing present within a particular voxel there will be no magnetic resonance imaging signal to measure. In other cases a knowledge of the subject's anatomy may be used to at least partially identify the set of boundary voxels. In another example an edge finding algorithm may be used to identify where the object begins and the background begins in the set of voxels.

Execution of the machine-executable instructions further cause the processor to create a chosen phase candidate map in the memory. The chosen phase candidate map comprises the set of voxels. In this example in the memory we have created a chosen phase candidate map which will then be populated with values from the two phase candidate maps or will be calculated using the two phase candidate maps. Execution of the machine-executable instructions further cause the processor to select a chosen phase map value for at least a portion of the set of boundary voxels in the chosen phase map from the two phase candidate maps. The phase map value is chosen by comparing the phase candidate map value for each of the set of boundary voxels in each of the phase candidate maps selecting the candidate phase map value which indicates the lowest fat-to-water ratio.

In this step there is an assumption made that the boundary of the subject, which may very likely be made of skin, has a lowest fat-to-water ratio out of the two phase candidate maps. This for instance would lead to selecting the value which is reasonable for skin. Execution of the machine-executable instructions further causes the processor to calculate the phase map value of the object voxels according to a phase candidate selection algorithm. Input for the phase candidate selection algorithm comprises the two phase candidate maps and the chosen phase map value for the at least a portion of the set of boundary voxels in the chosen phase map from the two phase candidate maps. The phase candidate selection algorithm is then used to calculate the phase map values that make up the chosen phase candidate map. These may include algorithms which smooth the boundary values and solve for boundary values in the middle, which calculate the value iteratively, or which calculate the value by propagating the solution.

This embodiment may be beneficial because the knowledge of the makeup of the surface of the subject may be used by a set of boundary values which are useful in calculating the chosen phase candidate map from the two phase candidate maps.

In another example the values of the object voxels which are not members of the set of boundary voxels are set to a predetermined value as input when the phase map values are calculated. For example if an iterative phase candidate estimation algorithm is used it may be useful to set the phase map value to zero or some other low value to initialize the algorithm.

In another embodiment the object identification algorithm identifies a voxel of the set of voxels as an object voxel when the voxel has a magnitude which is x times larger than the standard deviation of the noise in the input data sets and has an amplitude of at least y of a maximum amplitude in the input datasets. x is a first predetermined value. y is a second predetermined value that is less than or equal to 1. This is an example of one possible algorithm for identifying whether a voxel is representing an object or the background. This example is included to be representative of an example which works well in practice.

In another embodiment x is between 3 and 5.
In another embodiment x is between 3.5 and 4.5.
In another embodiment x is between 2 and 4.
In another embodiment x is between 4 and 6.
In another embodiment y is between 0.06 and 0.08.
In another embodiment y is between 0.05 and 0.07.
In another embodiment y is between 0.07 and 0.09.
In another embodiment y is between $1/14$ and $1/16$.
In another embodiment y is between $1/13$ and $1/15$.
In another embodiment y is between $1/15$ and $1/17$.

The above values for x and y are examples of x and y which may be effective in identifying the object voxels in the two phase candidate maps.

In another embodiment the set of voxels has a border. The boundary identification algorithm causes the processor to identify the boundary voxels from object voxels that are path-wise connected to the border via the set of background voxels. This embodiment may exclude identifying boundary voxels which are within the subject. For example the use of this algorithm may force the algorithm to identify the skin of the subject as the set of boundary voxels and may cause it to ignore other boundary voxels such that are present in the lungs. This embodiment may not be applicable for all instances. For instance in some cases because of signal dephasing and corresponding amplitude decay the top of the subject or body may have a very weak signal. This may cause for instance a cavity caused by the lungs becoming connected to the background region. In other examples the identification of the lungs may be avoided by using an algorithm which also takes into account a knowledge of the subject's anatomy. For instance a deformable shape model may be used to identify various components of the subject's anatomy and better identify the location on the outer surface or skin of the subject.

In another embodiment the boundary identification algorithm causes the processor to identify the set of boundary voxels by identifying object voxels chosen from the set of object voxels that are adjacent to at least one background voxel chosen from the set of background voxels. In the following, any processing related to phases is to be understood in that the actual processing is carried on the phasors related to the phases by the relation phasor=exp(i*phase), where i is the imaginary unit.

In another embodiment the phase candidate selection algorithm causes the processor to calculate the phase map value of the object voxels by first interpolating the phase map value of the object voxels using the initially chosen phase map value for each of the set of boundary voxels and then correcting the phase map value of the object voxels with the two phase candidate maps according to an iterative algorithm. For example, initially the interior voxels may be set to a particular value. For example they may be set to be equal to zero. Then the value of the set of boundary voxels are used to interpolate the value of the other object voxels. This may then be compared to the two phase map values for each of the object voxels and the phase map value in the chosen phase candidate map may then be corrected using the two phase candidate maps. The interpolation may then be performed again and the comparison with the two phase candidate maps. This may be repeated until the solution of the object voxels in the chosen phase candidate map converge to a solution.

In another embodiment the iterative algorithm comprises selecting a temporary phase map value for each of the set of interior voxels by choosing the phase map value from the two phase candidate maps, which is closest to the phase map value in the chosen phase candidate map. Next the iterative algorithm also comprises replacing the phase map value for each of the object voxels with the temporary phase map value. The iterative algorithm further comprises smoothing the phase map value of the object voxels using a spatial smoothing filter. The iterative algorithm further comprises repeating the iterative algorithm until the phase map value for each of the set of object voxels converges to the predetermined criteria. The predetermined criteria or criterion may for example be a maximum change in the value of the voxels per iterative loop or to a statistical measure which measures how much the values change overall.

In another embodiment the phase map value of the object voxels is interpolated using the spatial smoothing filter.

In another embodiment the iterative algorithm comprises selecting the chosen phase map value for the local voxels by choosing the phase map value from the two phase candidate maps which is closest to the value of the local voxels in the chosen phase candidate map. The local voxels are chosen from the set of interior voxels and are within a predetermined distance from the set of boundary voxels. The iterative algorithm further comprises transferring the local voxels from the set of interior voxels to the set of boundary voxels. The iterative algorithm further comprises interpolating the value of interior voxels within the set of object voxels using the chosen phase map value for each of the set of boundary voxels. The iterative algorithm further comprises repeating the iterative algorithm until all the set of interior voxels are a member of the set of boundary voxels. In this embodiment the value of the object voxels near the set of boundary voxels are calculated. This is because it is assumed that the value of the true phase map adjacent to the known boundary conditions can be used to accurately decide which of the voxels from the two phase candidate maps should be selected. Once a voxel has been selected this can then be used to calculate the value voxels adjacent to it. This embodiment thus calculates the solution as a propagation through the various voxels.

In another embodiment the memory further comprises a prior phase map. The phase candidate selection algorithm causes the processor to calculate the phase map value of the object voxels by solving a minimization algorithm. The minimization algorithm comprises a first penalty term that measures the deviation of the phase map value of the boundary voxels from corresponding voxels in the prior phase map. The minimization algorithm comprises a second penalty term that measures the spatial variation of the phase map of the object voxels. In this example the calculation of the chosen phase candidate map is improved by using a prior knowledge from a prior phase map.

In another embodiment the phase candidate selection algorithm causes the processor to calculate the phase map value of interior voxels according to a TRWS algorithm.

In another embodiment the machine-executable instructions further cause the processor to reconstruct a magnetic resonance image with the magnetic resonance data and the chosen phase map. In this step the Dixon method is completed and a magnetic resonance image is reconstructed.

In another aspect the invention provides for a computer program product comprising machine-executable instructions for execution by a processor controlling the magnetic resonance imaging system for acquiring magnetic resonance data from the subject that is within an imaging zone. The magnetic resonance imaging system comprises a memory for storing pulse sequence data. The pulse sequence data comprises commands for acquiring the magnetic resonance data using an n point Dixon magnetic resonance imaging method. n is greater than or equal to 2. Execution of the instructions causes the processor to control the magnetic resonance imaging system with the pulse sequence data to acquire the magnetic resonance data. Execution of the machine-executable instructions further cause the processor to construct two phase candidate maps using the magnetic resonance data according to the n point Dixon magnetic resonance imaging method. Each of the two phase candidate maps are in image space. Each of the two phase candidate maps comprises a set of voxels. The set of voxels may be identical. Each voxel has a phase map value.

Execution of the machine-executable instructions further cause the processor to divide each of the set of voxels into a set of object voxels and a set of background voxels using an object identification algorithm. Execution of the machine-executable instructions further cause the processor to identify a set of boundary voxels and interior voxels within the set of object voxels using the boundary identification algorithm. Execution of the machine-executable instructions further cause the processor to create a chosen phase candidate map in the memory. The chosen phase candidate map comprises the set of voxels. The chosen phase candidate map has its own set of voxels that may have a different value than either of the two phase candidate maps. Execution of the machine-executable instructions further cause the processor to select a chosen phase map value for at least a portion of the set of boundary voxels in the chosen phase map from the two phase candidate maps. The phase map value is chosen by comparing the candidate phase map value for each of the set of boundary voxels in each of the two phase candidate maps by selecting the candidate phase map value which indicates the lowest fat-to-water ratio. Execution of the machine-executable instructions further cause the processor to calculate the phase map value of the object voxels according to a phase candidate selection algorithm.

Input for the phase candidate selection algorithm comprises the two phase candidate maps and the chosen phase map value for at least a portion of the set of boundary voxels in the chosen phase map.

In another aspect the invention provides for a method of operating the magnetic resonance imaging system that is useful for acquiring magnetic resonance data from a subject within an imaging zone. The method comprises the step of controlling the magnetic resonance imaging system with pulse sequence data to acquire the magnetic resonance data. The pulse sequence data comprises commands for acquiring the magnetic resonance data using an or according to an n point Dixon magnetic resonance imaging method. n is greater than or equal to 2. n may be an integer. The method further comprises the step of constructing two phase candidate maps using the magnetic resonance data according to the n point Dixon magnetic resonance imaging method. Each of the two phase candidate maps are in image space. Each of the two phase candidate maps comprises a set of voxels. The set of voxels in each of the two phase candidate maps may have different values. Each of the set of voxels has a phase map value. The value of each voxel may be different from the others. The method further comprises dividing each of the set of voxels into a set of object voxels and a set of background voxels using an object identification algorithm.

The method further comprises identifying a set of boundary voxels and interior voxels within the set of object voxels using a boundary identification algorithm. The method further comprises creating a chosen phase candidate map. The chosen phase candidate map comprises the set of voxels. This for instance may be done in the memory of a computer. The method further comprises the step of selecting a chosen phase map value for at least a portion of the set of boundary voxels in the chosen phase map from the two phase candidate maps. The phase map value is chosen by comparing the candidate phase map value for each of the set of boundary voxels in each of the two phase candidate maps and selecting the candidate phase map value which indicates the lowest fat-to-water ratio. This is done for each individual voxel. The fat-to-water ratio for each voxel is compared and the one with the lowest value is selected. The method further comprises calculating the phase map value of the object voxels according to a phase candidate selection algorithm. Input for the phase candidate selection algorithm comprises the two phase candidate maps and the chosen phase map value for at least a portion of the set of boundary voxels in the chosen phase map.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
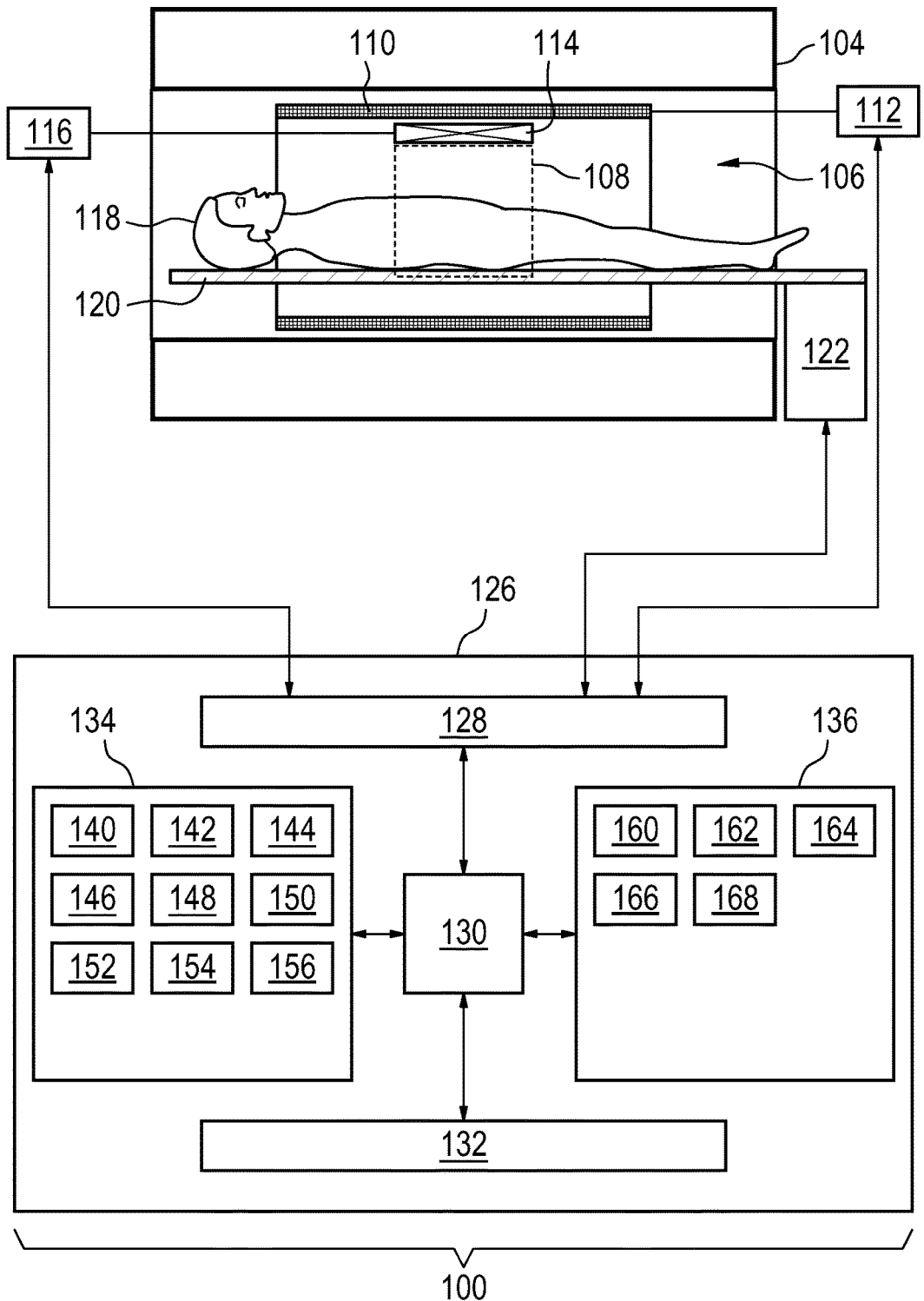
FIG. 1 illustrates an example of a magnetic resonance imaging system.

FIG. 1 shows an example of a magnetic resonance imaging system 100 with a magnet 104. The magnet 104 is a superconducting cylindrical type magnet 104 with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels.

Within the bore 106 of the magnet 104 there is a subject support 120 which is attached to an optional actuator 122 that is able to move the subject support and the subject 118 through the imaging zone 108 The transceiver 116, the magnetic field gradient coil power supply 112 and the actuator 122 are all see as being connected to a hardware interface 128 of computer system 126.

The contents of the computer storage 134 and the computer memory 136 may be interchangeable. In some examples the contents of the computer storage 134 may be duplicated in the computer memory 136.

The computer storage 134 is shown as containing a pulse sequence instructions 140 which acquire magnetic resonance data for use in an n point Dixon magnetic resonance imaging method. The computer storage 134 is further shown as containing magnetic resonance data 142 that was acquired by the magnetic resonance imaging system 100 using the pulse sequence instructions 140. The computer storage 134 is further shown as containing a first phase candidate map 144 and a second phase candidate map 146 that were calculated from the magnetic resonance data 142. The computer storage 134 is further shown as containing the identification of a set of object voxels 148 in both the first phase candidate map 144 and the second phase candidate map 146. For example 148 could be the identification of particular voxels in both images.

The computer storage 134 is further shown as containing a set of interior voxels 150. The set of interior voxels could be the identification of voxels which are the members of the set of object voxels 148. The computer storage 134 is further shown as containing a set of boundary voxels 152. The set of boundary voxels may be the voxels chosen from the set of object voxels 148 that are not members of the set of interior voxels 150. The computer storage 134 is further shown as containing a chosen phase candidate map 154 that was calculated using the values for the set of boundary voxels 152 and the first 144 and second 146 phase candidate maps. The computer storage 134 is further shown as containing a magnetic resonance image 156 that was calculated using the chosen phase candidate map and the magnetic resonance data 142 according to an n point Dixon magnetic resonance imaging method. n is an integer which is greater than or equal to 2.

The computer memory 136 is shown as containing a control module. The control module contains computer executable code which enables the processor 130 to control the operation and function of the magnetic resonance imaging system 100 and also to execute a method of performing and analyzing magnetic resonance data according to an n point Dixon magnetic resonance imaging method. The computer memory 136 is further shown as containing a phase candidate generation module 162 that is able to generate the first 144 and second 146 phase candidate maps from the magnetic resonance data 142. The computer memory 136 is further shown as containing an object identification algorithm module 164 that enables the identification of the object voxels 148 in the first 144 and second 146 phase candidate maps.

The computer memory 136 is further shown as containing a phase candidate selection algorithm 166 that is able to calculate or estimate the value of the chosen phase candidate map 154 from the first phase candidate map 144, the second phase candidate map 146, and the value of the set of boundary voxels 152 in the chosen phase candidate map 154. The computer memory 136 is further shown as containing an image reconstruction module 168. The image reconstruction module contains computer-executable code which enables the processor 130 to calculate the magnetic resonance image 156 from the magnetic resonance data 142 and the first 144 and second 146 phase candidate maps. When performing a Dixon method the magnetic resonance image 156 may in some instances be more than one magnetic resonance image. For example the fat and water tissues may be plotted in the same image or in some cases the fat and water may be plotted or displayed in separate images.

Figure 2:
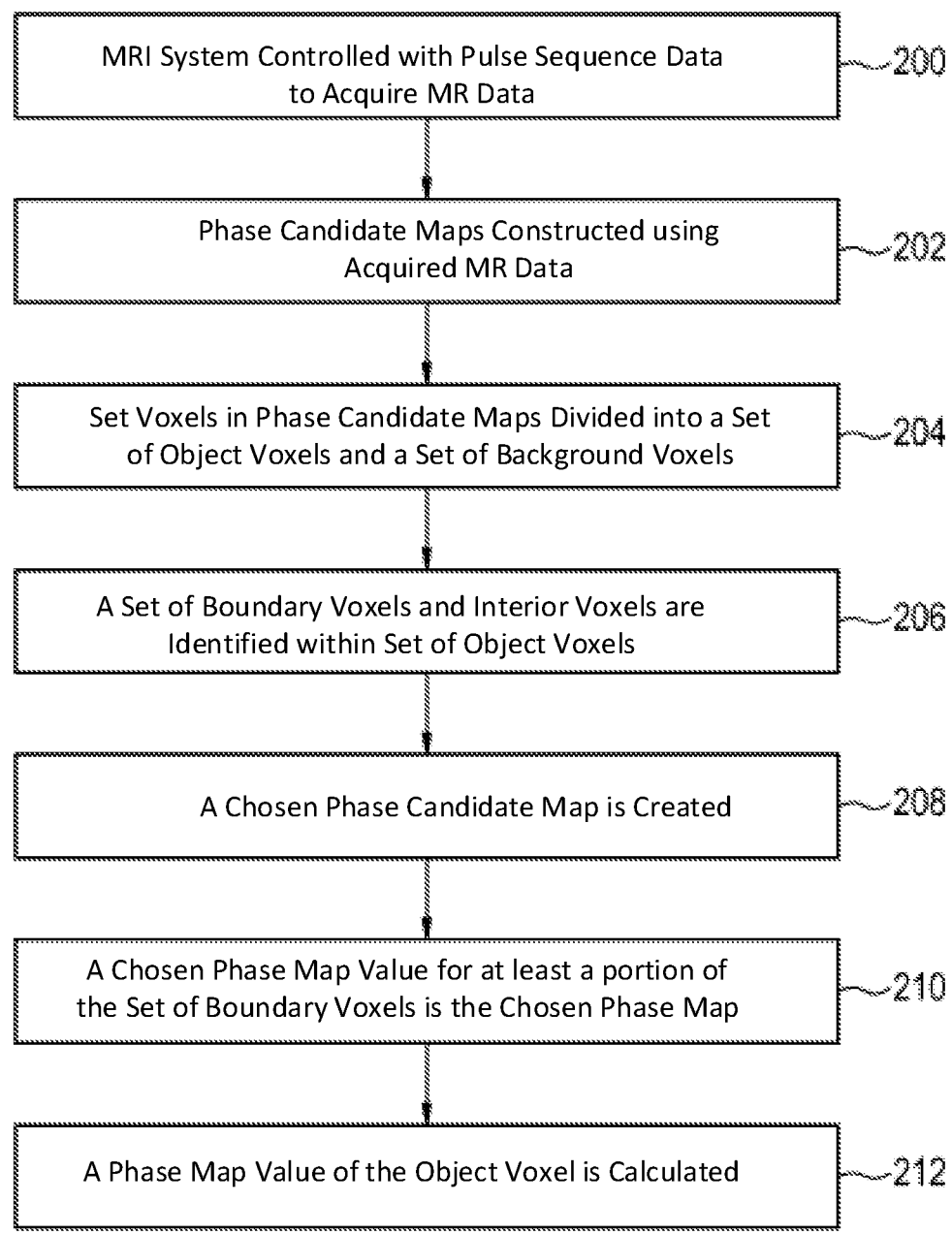
FIG. 2 shows a flow chart which illustrates a method of operating the system of FIG. 1.

FIG. 2 shows a flow chart which illustrates an example of a method of operating the magnetic resonance imaging system 100 of FIG. 1. First in step 200 the magnetic resonance imaging system 100 is controlled with the pulse sequence data 140 to acquire the magnetic resonance data 142. Next in step 202 the two phase candidate maps 144, 146 are constructed using the magnetic resonance data 142 according to the n point Dixon magnetic resonance imaging method. Each of the two phase candidate maps 144, 146 are in image space. They both comprise a set of voxels. Each voxel of the phase candidate maps has a phase map value. Next in step 204 the set of voxels in both phase candidate maps 144, 146 are divided into a set of object voxels and a set of background voxels. This is done using the object identification algorithm 164. The object voxels in the first phase candidate map 144 are the same as the object voxels in the second phase candidate map 146. As such the background voxels in the first phase candidate map 144 and the second phase candidate map 146 are also the same. Next in step 206 a set of boundary voxels and interior voxels are identified within the set of object voxels using a boundary identification algorithm. The boundary identification algorithm may take different forms and is not shown in FIG. 1. It may be as simple as an edge identification algorithm or it may be a more complicated algorithm. Next in step 208 a chosen phase candidate map 154 is created in the memory 134 or 136. The chosen phase candidate map comprises the set of voxels. That is to say the chosen phase candidate map is created in memory and has the same dimensions and voxels as the two phase candidate maps 144, 146. In the remainder of the algorithm the values of the chosen phase candidate map will be filled. Next in step 210 a chosen phase map value for at least a portion of the set of boundary voxels in the chosen phase map 154 is selected from the two phase candidate maps 144, 146. The phase map values are chosen by comparing the candidate phase map value for each of the set of boundary voxels in each of the two phase candidate maps by selecting the candidate phase map value which indicates the lowest fat-to-water ratio. For each of the boundary values the algorithm would go and look at the corresponding voxels in the two phase candidate maps 144, 146. The value which has the lowest fat-to-water ratio would then be selected and copied into the chosen phase map value at that particular voxel. Finally in step 212, the phase map value of the object voxel is calculated according to a phase candidate selection algorithm. The phase candidate selection algorithm leaves as input the two phase candidate maps 144, 146 and also use the chosen phase map values for at least a portion of the set of boundary voxels in the chosen phase map 154. The value of the boundary voxels serves as a boundary condition which is used to improve the estimate of the chosen phase map.

The Dixon method is becoming of increasing importance for the separation of water and fat and for the determination of fat fractions. Both FFE and TSE methods are in use and the technique is used for various anatomies.

In Dixon scans, phase terms arise, corresponding with B0 variations, eddy currents, and possibly, other effects. These phase terms have to be dealt with in the processing of Dixon data and therefore have to be determined. In the processing of Dixon data, multiple (typically two) candidates for these phase terms are obtained for each voxel. This phase ambiguity has to be resolved.

The selection methods mentioned above frequently fail to select the right candidates, leading to swaps of water and fat in parts of the output volume. This occurs often in clinical use.

Examples as described herein may reduce the chance of swapping water and fat by using more and better prior knowledge about the phase map properties in the selection process. The prior knowledge used in the invention mainly consists of the following ingredients, the first two of which are also used in known methods:

The phase should be relative close to zero for a large part of the volume.

Spatial smoothness of the phase map.

Prior knowledge on the human body. The knowledge used for this invention is that the skin is a layer, roughly 2-3 mm thick and contains significantly more water than fat. So for the voxels largely in this layer, the choice between the two candidates can be made on the basis of that information.

Any selection method can benefit from the prior knowledge of the skin, simply by replacing, in the skin layer, the two distinct candidates, by two identical candidates, where the water candidate is selected to replace the fat candidate. Since the selection at the skin can be wrong, due to various practical reasons, this approach is maybe somewhat too restrictive in the usage of this prior knowledge. A better approach may be to use the skin information in a more flexible way. As initialization or "guiding" way, allowing the algorithm to deviate from the initial choice if needed. How this is precisely achieved depends on the field map selection method chosen. Below two methods are described: iterative filtering and TRWS.

Iterative Filtering:

For the method of iterative filtering the initialization method can be adapted while the rest of the procedure remains the same. The processing steps of the proposed initialization method may contain one or more of the following steps:

Designate a voxel as a "object voxel" when its magnitude (actually the maximum magnitude over the echoes) is larger than 5 times the standard deviation of the noise. All other voxels will be referred to as "background voxels".

Designate a voxel to be a skin voxel or a boundary voxel when it is an object voxel and when at least one its neighbors (4 in 2D, 6 in 3D, except for voxels at the edges of the field of view) is a background voxel.

For the skin voxels thus determined, accept only those voxels for prior information when one of its candidates has a fat/water ratio lower than 0.1. As an alternative all skin or boundary voxels could be used.

For the thus selected skin voxels, select the candidate with the lowest fat/water ratio. Fill the object voxels of the chosen phasor candidate map with the corresponding value determined in step 3. Set all other voxels of this initial map to the value zero, so that they won't contribute to the subsequent smoothing operation.

The thus obtained initial map is spatially smoothed with the standard settings of the iterative filtering method.

All voxels that are not filled in this way with a non-zero value, are set to the value of 1 (corresponding to phase 0)

Due to the last step it is clear that, for those areas where the skin voxels have no influence, the skin initialization algorithm is equal to the "phase 0" initialization method. For the very specific situation that there are no skin voxels at all, the skin initialization is even fully equivalent to that method.

With this algorithm, the edges of the lungs or other voids of the body, are also treated as "skin", or more precise, as water voxels. In some examples, this is intended. In other examples modifications to the algorithm can be made to ignore the edges of the lungs or other voids of the body.

Figure 4:
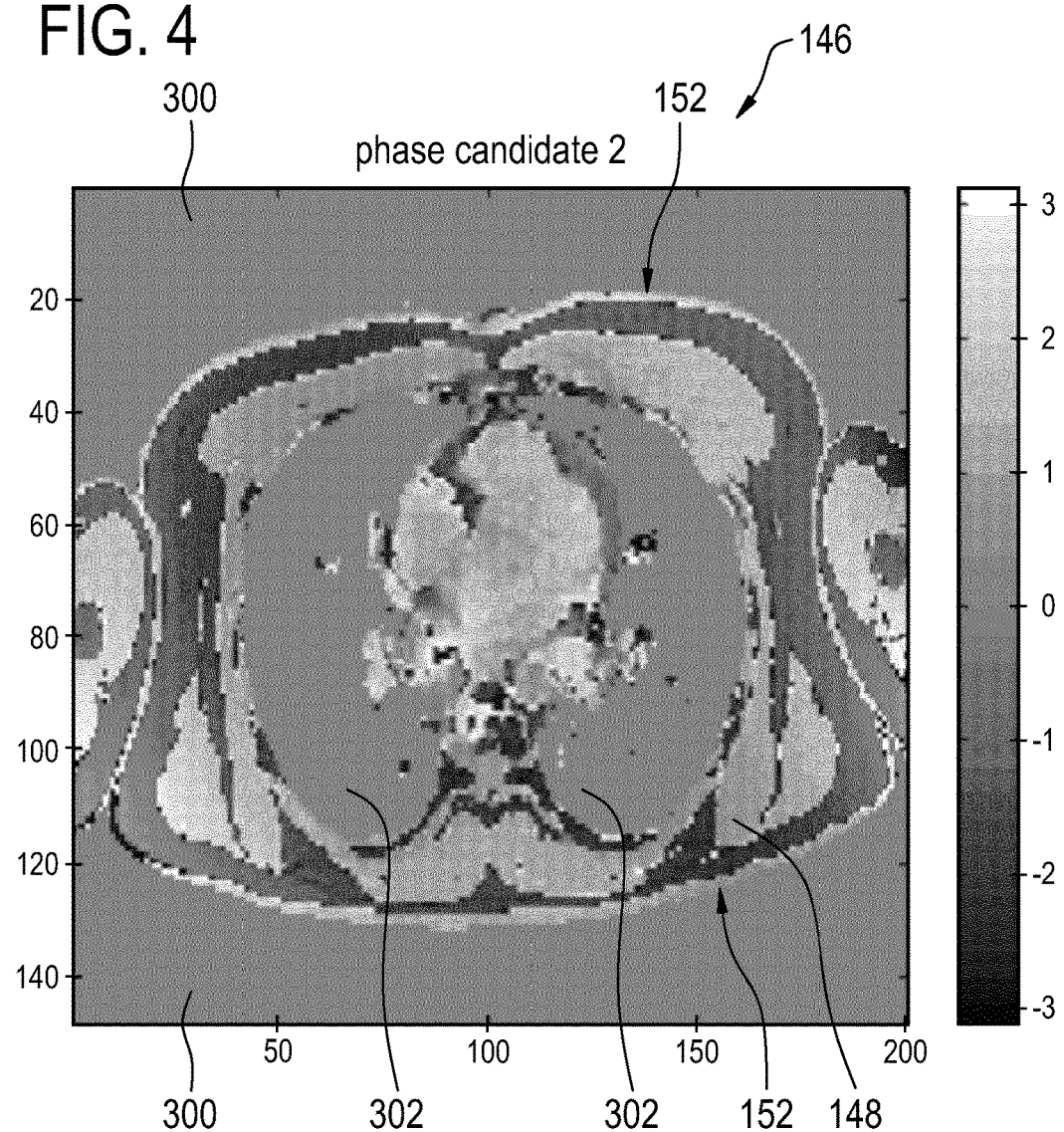
FIG. 4 shows an example of a second phase candidate map.
Figure 5:
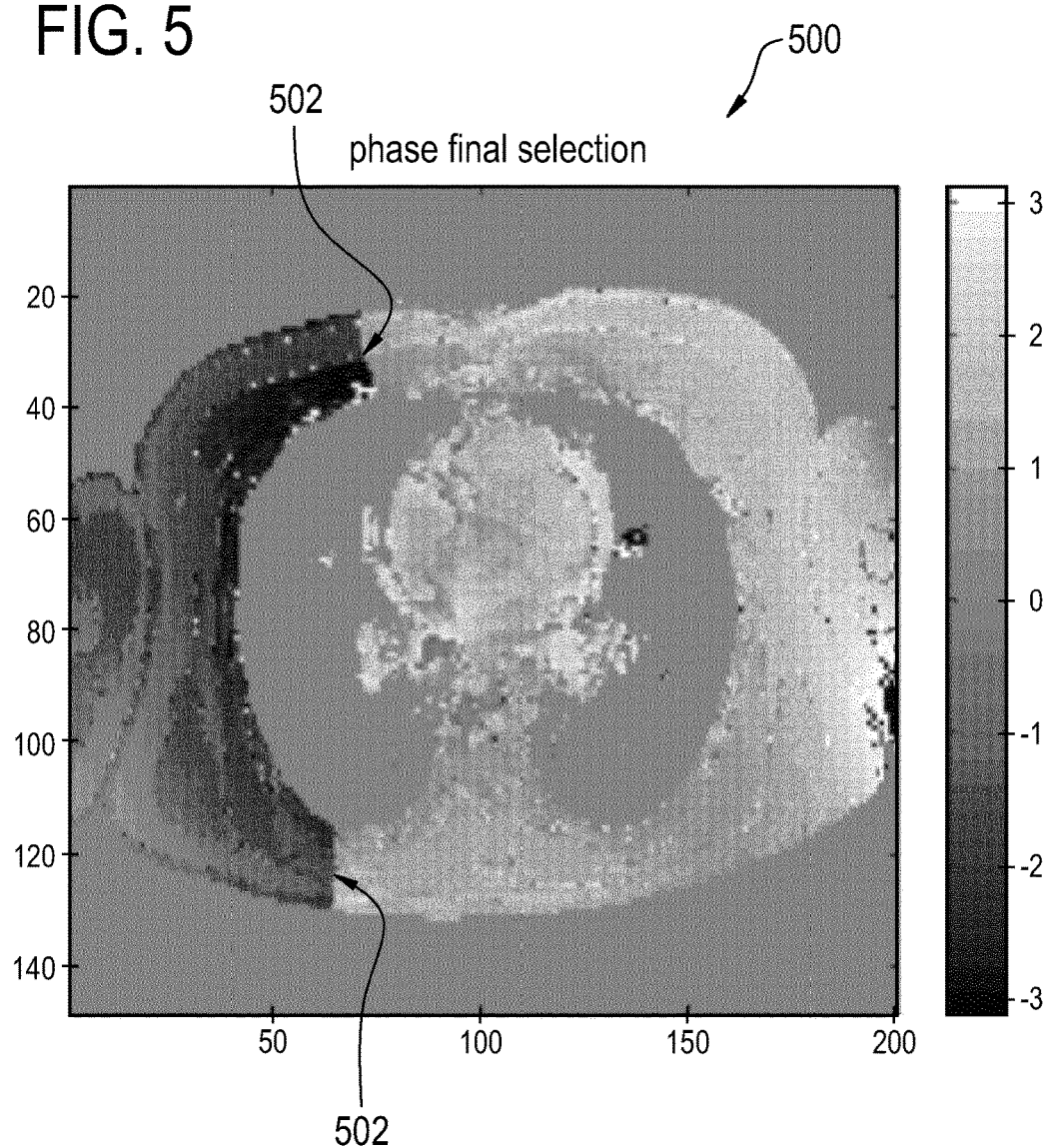
FIG. 5 shows a first example of a chosen phase candidate map.
Figure 6:
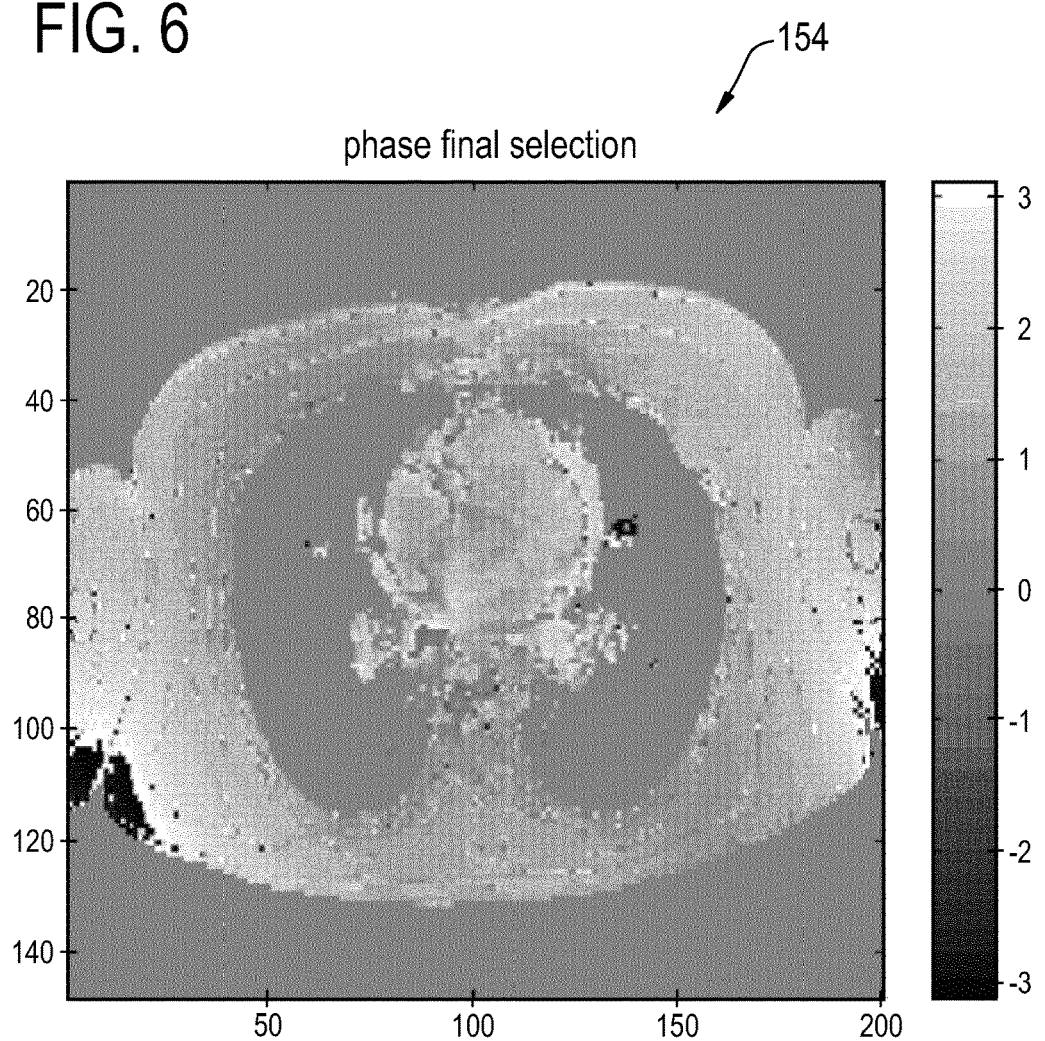
FIG. 6 shows a second example of a chosen phase candidate map.

An example for the method of iterative filtering is shown below. One slice out of a 3D scan is shown, containing parts of the lungs. See FIGS. 3 and 4 for the phase candidates. FIG. 5 shows the and the result of the conventional iterative selection procedure (without the prior knowledge of the skin). FIG. 6 shows the results of an iterative method that uses the prior knowledge about the skin.

Figure 3:
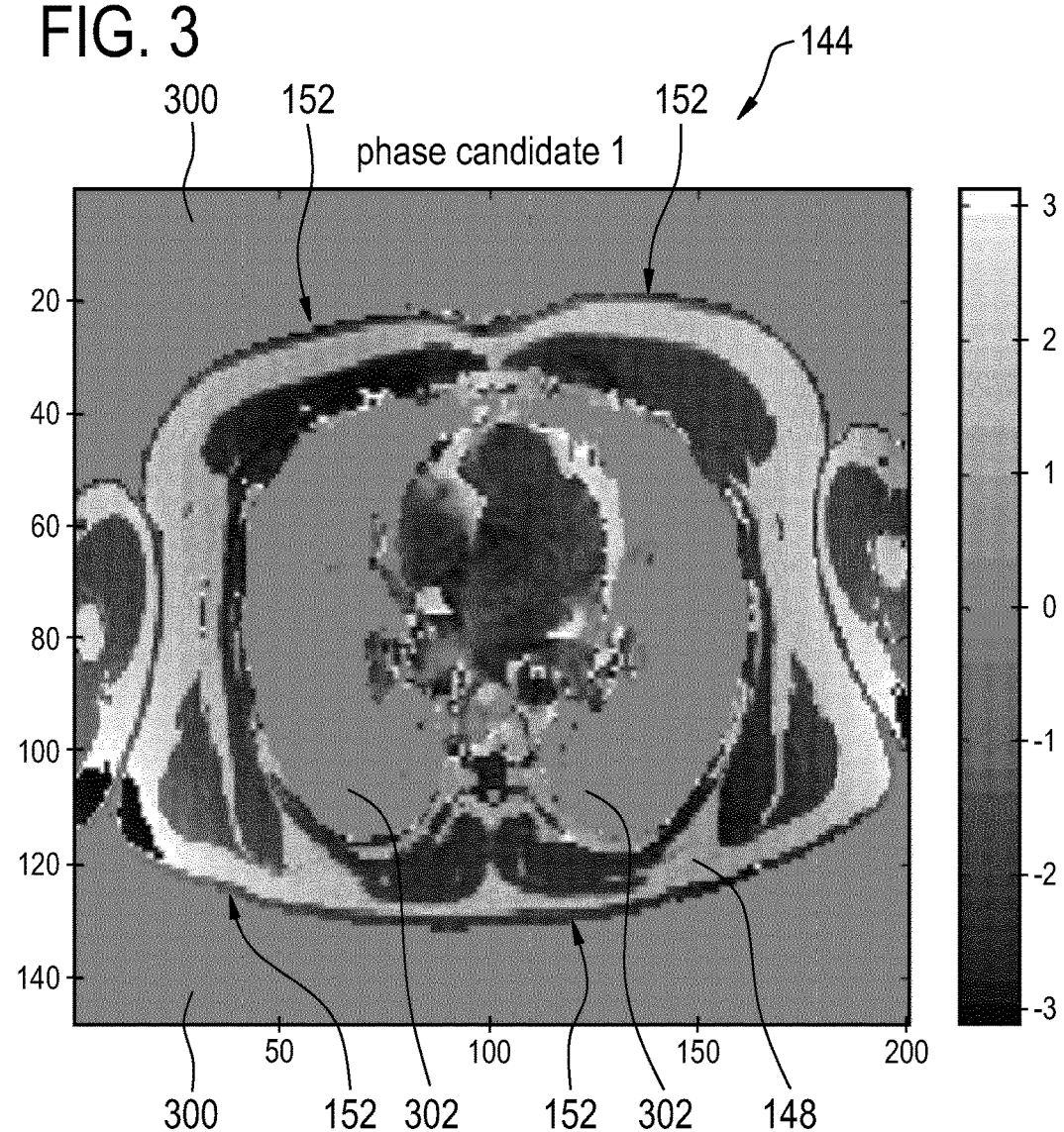
FIG. 3 shows an example of a first phase candidate map.

FIG. 3 shows an example of a first phase candidate map 144. FIG. 4 shows an example of a second phase candidate map 146. The first phase candidate map 144 and the second phase candidate map 146 were both calculated from the same magnetic resonance data. In both Figs. there can be seen that the voxels can be divided into background voxels 300 and a set of object voxels 148. Also this image shows a cross-section of a torso. It can be seen that there are a number of interior lung voxels 302 which also do not provide a magnetic resonance signal. Between the background voxels 300 and the object voxels 148 there is a set of boundary voxels 152. The boundary voxels 152 in this case are skin. The content of the outer skin layer is known. The voxels which form the set of boundary voxels 152 in images 144 and 146 can be compared and the value of the voxel which indicates the lowest fat-to-water ratio is then selected to be placed into a chosen phase candidate map.

FIG. 5 shows a prior art 500 chosen phase candidate map. The phase candidate map 500 shown in FIG. 5 was chosen using an algorithm that did not use the known value of the set of boundary voxels 152 as a boundary condition. It can be seen that when the phase candidate map 500 was calculated there was a non-physical solution which resulted in an abrupt transition which identified part of the image as fat and part as water. This resulted in the non-physical artifact 502 with a non-real transition between fatty tissue and water tissue.

FIG. 6 shows an example of a chosen phase candidate map 154 calculated according to an example as illustrated herein. In this example it can be seen that the non-physical artifact 502 of FIG. 5 is not present. The use of the known value of the set of boundary voxels 152 helped the numerical algorithm to choose the proper phase map value for each of the voxels in the chosen phase candidate map 154.

Figure 7:
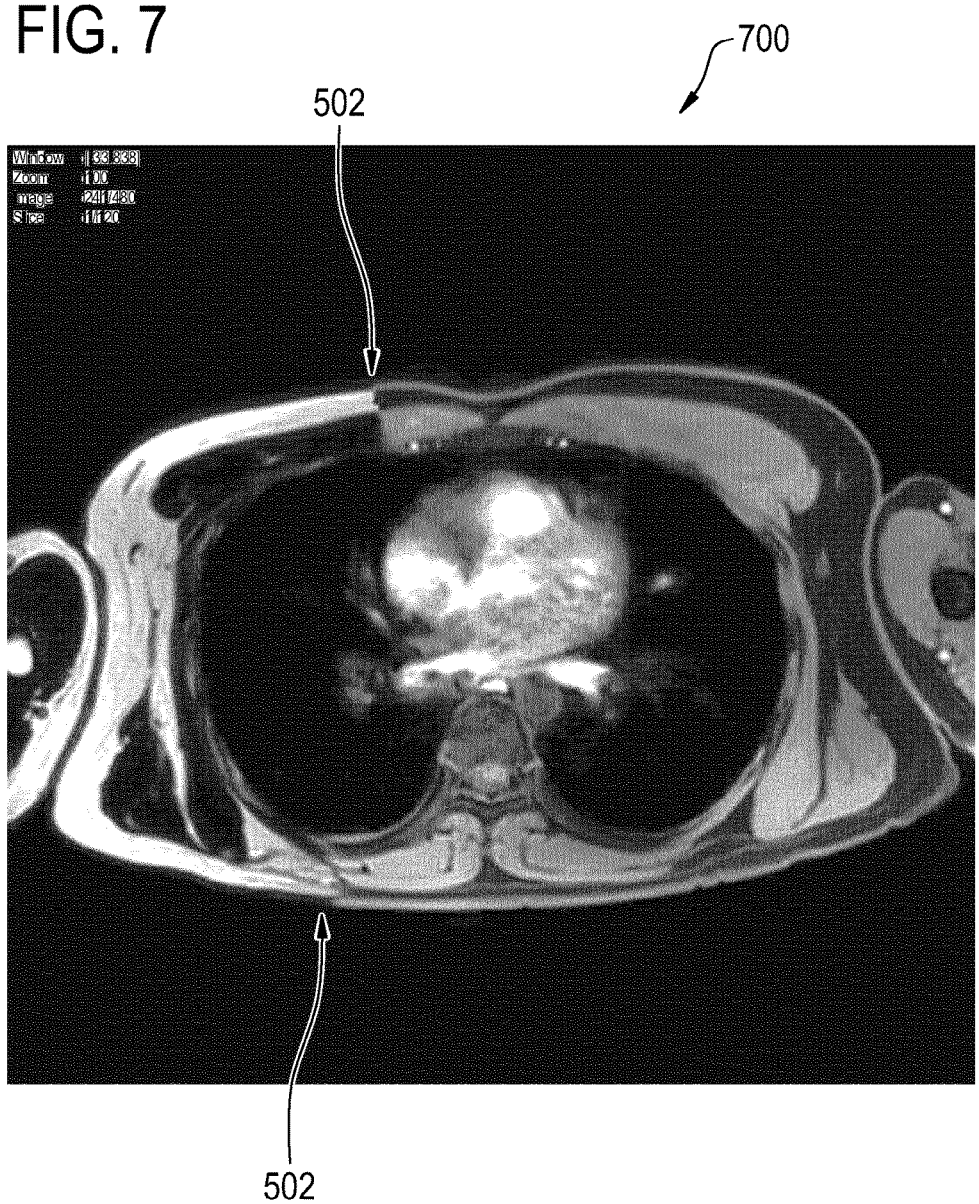
FIG. 7 shows a first example of a magnetic resonance image.

FIG. 7 shows a magnetic resonance image 700 that was calculated using the phase map 500 from FIG. 5. It can be seen that the same non-physical artifact 502 is present in this magnetic resonance image 700 also.

Figure 8:
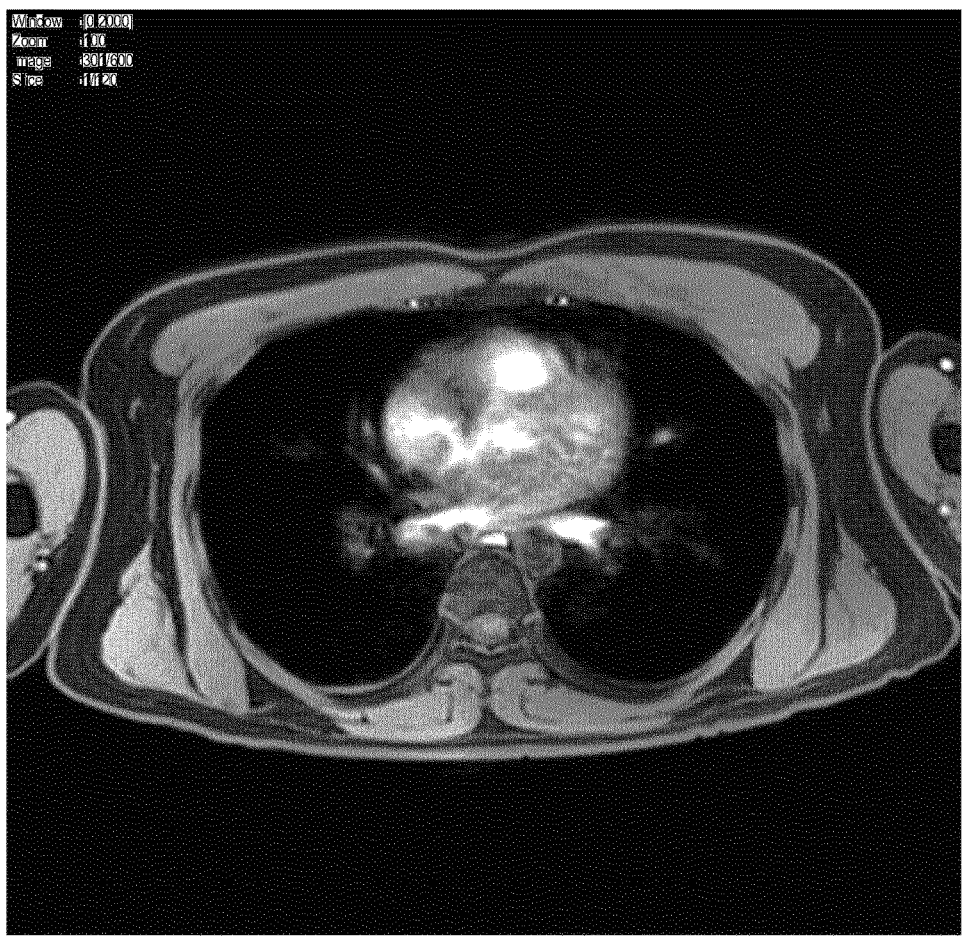
FIG. 8 shows a second example of a magnetic resonance image.

FIG. 8 shows a magnetic resonance image 156 that was calculated using the chosen phase candidate map 154 of FIG. 6. It can be seen that there is no non-physical artifact present in this image 156. FIG. 8 illustrates how examples as described herein can be used to produce a magnetic resonance image 156 which has a reduced chance of having non-physical artifacts due to the improper identification of fat or water using an n point Dixon magnetic resonance imaging method.

TRWS Method

TRWS (tree reweighted search) is an optimization algorithm is described in Kolmogorov, Vladimir. "Convergent tree-reweighted message passing for energy minimization." Pattern Analysis and Machine Intelligence, IEEE Transactions on 28.10 (2006): 1568-1583. An application of the TRWS method to Dixon magnetic resonance imaging is described in Berglund et al., Two-Point Dixon Method with Flexible Echo Times, MRM 65: 994-1004 (2011).

For the field map selection problem TRWS can be used to select the phase values (field map) by formulation an optimization problem ensuring spatial smoothness of the field map. In examples contained herein TRWS may be applied by modifying the cost function by adding a term which ensures that the selection related to the voxels of the skin is guided by the preselection (based on the water solution) at the skin. The first three steps of such a method would be identical to those of the iterative filtering method described above. Step 4 of the iterative method described above would be modified to:

For the thus selected skin voxels, select the candidate with the lowest fat/water ratio to be used as prior knowledge.

Then the method above describe iterative method would proceed as follows: Let $b_s$ represent the phase at spatial position s. $b_s$ can either represent a phase $\phi$ or its corresponding phasor $e^{j\phi}$ and can take a discrete number (typically two, but more for some applications) of values. Let $b_s^p$ represent prior knowledge on the phase term and let $\Delta_{st}$ be the spatial distance between neighbouring voxels s, t. Then the problem can be formulated as finding the minimum of the function $$E(b)\sum_s \left(\frac{|b_s^p - b_s|}{\sigma_{b,s}}\right)^{p_1} + \sum_s \sum_{t \in E_s} \left(\frac{|b_s - b_t|}{\Delta_{st}\sigma_{g,st}}\right)^{p_2},$$

where the vector b contains the phase terms $b_s$ for all voxels s. $\sigma_{b,s}$ represents the uncertainty in the deviation from the prior phase map, and $\sigma_{g,st}$ the uncertainty in the penalty term of the phase gradient. Both can be chosen to be spatially dependent. $E_s$ represents the set of neighbouring voxels of voxel s. Although multiple choices could be made here, typically 6 neigbouring voxels are used in 3D and four neighbouring voxels are used in 2D. The powers $p_{1,2}$ can typically be chosen to be 1 or 2. A value of 1 will put lower penalty on large deviations than a power of 2.

The first term relates to the prior phase map, while the second term relates to the spatial smoothness property. In case $\sigma_{g,st}\Delta_{st} \ll \sigma_{p,s}$ for all voxels and voxel pairs, then only the smoothness term is effectively used. If furthermore $\sigma_{g,st}$ is taken to be inversely proportional to the minimum of the data amplitudes of voxels s, t and $p_2$ is taken to be equal to 2, then the function to be minimized is equivalent to the one used by Berglund [1], apart from an arbitrary constant:

$$E(b)\sum_s \sum_{t \in E_s} \min(|m_s|, |m_t|)\left(\frac{|b_s - b_t|}{\Delta_{st}}\right)^2$$

In that respect the problem formulation is significantly more general than Berglund's. The form of the function as given in the first equation can be solved efficiently by the TRWS algorithm.

In the particular context of the usage of prior knowledge of the skin, then the first term of the function to be optimized contains only voxels at the boundary (skin) location. The vector $b_s^p$ would contain the phases or phasors related to the water solution.

Examples may be used in Dixon scans, but is of particular interest for those scans with a higher chance on swaps, such as scans close to the lungs and/or armpits, and scans with a large field of view, that typically experience larger phases, due to B0 inhomogeneity close to the edge of the homogeneity ellipsoid. The method can also be very useful for (parts of) scans with disconnected body parts, for example, lower legs stations.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance system
104 magnet
106 bore of magnet
108 measurement zone or imaging zone
110 magnetic field gradient coils
112 magnetic field gradient coil power supply
114 radio-frequency coil
116 transceiver
118 subject
120 subject support
122 actuator
125 slices
126 computer system
128 hardware interface
130 processor
132 user interface
134 computer storage
136 computer memory
140 pulse sequence instructions
142 magnetic resonance data
144 first phase candidate map
146 second phase candidate map
148 set of object voxels
150 set of interior voxels
152 set of boundary voxels
154 chosen phase candidate map
156 magnetic resonance image
160 control module
162 phase candidate generation module
164 object identification algorithm module
166 phase candidate selection algorithm
168 image reconstruction module
200 control the magnetic resonance imaging system with the pulse sequence data to acquire the magnetic resonance data
202 construct two phase candidate maps using the magnetic resonance data according to an n point Dixon magnetic resonance imaging method
204 divide each of the set of voxels into a set of object voxels and a set of background voxels using an object identification algorithm
206 identify a set of boundary voxels and interior voxels within the set of object voxels using a boundary identification algorithm
208 create a chosen phase candidate map in the memory
210 select a chosen phase map value for at least a portion of the set of boundary voxels in the chosen phase map from the two phase candidate maps
212 calculate the phase map value of the object voxels according to a phase candidate selection algorithm
300 background voxels
302 interior lung voxels
500 prior art chosen phase candidate map
502 non-physical artifact
600 magnetic resonance image
700 magnetic resonance image

The invention claimed is:

1. A magnetic resonance imaging system for acquiring magnetic resonance data from a subject within an imaging zone, wherein the magnetic resonance imaging system comprises:
 a memory for storing machine executable instructions and pulse sequence data, wherein the pulse sequence data comprises commands for acquiring the magnetic resonance data using an n point Dixon magnetic resonance imaging method, wherein n is an integer greater than or equal to two; and
 a processor for controlling the magnetic resonance imaging system, wherein execution of the instructions causes the processor to:
  control the magnetic resonance imaging system with the pulse sequence data to acquire the magnetic resonance data;
  construct two phase candidate maps using the magnetic resonance data according to the n point Dixon magnetic resonance imaging method, wherein each of the two phase candidate maps are in image space, wherein each of the two phase candidate maps comprise a set of voxels, and wherein each voxel has a phase map value;
  identify a set of object voxels in the set of voxels using an object identification algorithm;
  identify a set of boundary voxels and interior voxels within the set of object voxels using a boundary identification algorithm;
  create a chosen phase candidate map in the memory, wherein the chosen phase candidate map comprises the set of voxels;
  select a chosen phase map value for at least a portion of the set of boundary voxels in the chosen phase map from the two phase candidate maps, wherein the phase map value is chosen by comparing the candidate phase map value for each of the set of boundary voxels in each of the two phase candidate maps selecting the candidate phase map value which indicates the lowest fat to water ratio; and
  calculate the phase map value of the object voxels according to a phase candidate selection algorithm, wherein input for the candidate selection algorithm comprises the two phase candidate maps and the chosen phase map value for the at least a portion of the set of boundary voxels in the chosen phase map.

2. The magnetic resonance imaging system of claim 1, wherein the object identification algorithm identifies a voxel of the set of voxels as an object voxel when the voxel has a magnitude which is x times larger than the standard deviation of the noise in the two phase candidate maps and has a amplitude of at least y of a maximum amplitude in the n input data sets wherein x is a first predetermined value, and wherein y is a second predetermined value that is less than or equal to 1.

3. The magnetic resonance imaging system of claim 2, wherein x any one of the following: between 3 and 5, between 3.5 and 4.5, between 2 and 4, between 4 and 6; and wherein y is any one of the following: between 0.06 and 0.08, between 0.05 and 0.07, between 0.07 and 0.09, between $\frac{1}{14}$ and $\frac{1}{16}$, between $\frac{1}{13}$ and $\frac{1}{15}$, and between $\frac{1}{15}$ and $\frac{1}{17}$.

4. The magnetic resonance imaging system of claim 1, wherein the set of voxels has a border, wherein the boundary identification algorithm causes the processor to identify the set of boundary voxels from object voxels that are path wise connected to the border via the set of background voxels.

5. The magnetic resonance imaging system of claim 1, wherein the boundary identification algorithm causes the processor to identify the set of boundary voxels by identifying object voxels chosen from the set of object voxels that are adjacent to at least one background voxels chosen from the set of background voxels.

6. The magnetic resonance imaging system of claim 1, wherein the phase candidate selection algorithm causes the processor to calculate the phase map value of the object voxels by:
  interpolating the phase map value of the object voxels using the initially chosen phase map value for each of the set of boundary voxels; and
  correct the phase map value of the object voxels with the two phase candidate maps according to an iterative algorithm.

7. The magnetic resonance imaging system of claim 6, wherein the iterative algorithm comprises:
  selecting a temporary phase map value for each of the set of interior voxels by choosing the phase map value from the two phase candidate maps which is closest to the phase map value in the chosen phase candidate map;
  replacing the phase map value for each of the object voxels with the temporary phase map value;
  smoothing the phase map value of the object voxels using a spatial smoothing filter; and
  repeating the iterative algorithm until the phase map value for each of the set of object voxels converges to predetermined criteria.

8. The magnetic resonance imaging system of claim 7, wherein the phase map value of the object voxels is interpolated using the spatial smoothing filter.

9. The magnetic resonance imaging system of claim 6, wherein the iterative algorithm comprises:
  selecting the chosen phase map value for local voxels by choosing the phase map value from the two phase candidate maps which is closest to the value of the local voxels in the chosen phase candidate map, wherein the local voxels are chosen from the set of interior voxels and are within a predetermined distance from the set of boundary voxels;
  transferring the local voxels from the set of interior voxels to the set of boundary voxels;
  interpolating the value of the interior voxels within the set of object voxels using the chosen phase map value for each of the set of boundary voxels; and
  repeating the iterative algorithm until all of the set of interior voxels are a member of the set of boundary voxels.

10. The magnetic resonance imaging system of claim 6, wherein the memory further contains a prior phase map, wherein the phase candidate selection algorithm causes the processor to calculate the phase map value of the object voxels by solving a minimization algorithm, wherein the minimization algorithm comprises a first penalty term that measures the deviation of the phase map value of the boundary voxels from corresponding voxels in the prior phase map, wherein the minimization algorithm comprises a second penalty term that measures the spatial variation of the phase map value of the object voxels.

11. The magnetic resonance imaging system of claim 6, wherein the phase candidate selection algorithm causes the processor to calculate the phase map value of the interior voxels according to a TRWS algorithm.

12. The magnetic resonance imaging system of claim 1, wherein the machine executable instructions further cause the processor to reconstruct a magnetic resonance image with the magnetic resonance data and the chosen phase map.

13. A computer program product comprising machine executable instructions for execution by a processor controlling a magnetic resonance imaging system for acquiring magnetic resonance data from a subject within an imaging zone, wherein the magnetic resonance imaging system comprises a memory for storing pulse sequence data, wherein the pulse sequence data comprises commands for acquiring the magnetic resonance data using an n point Dixon magnetic resonance imaging method, wherein n is greater than or equal to two, wherein execution of the instructions causes the processor to:
  control the magnetic resonance imaging system with the pulse sequence data to acquire the magnetic resonance data;
  construct two phase candidate maps using the magnetic resonance data according to the n point Dixon magnetic resonance imaging method, wherein each of the two phase candidate maps are in image space, wherein each of the two phase candidate maps comprise a set of voxels, and wherein each voxel has a phase map value;
  identifying a set of object voxels in the set of voxels using an object identification algorithm;
  identify a set of boundary voxels and interior voxels within the set of object voxels using a boundary identification algorithm;
  create a chosen phase candidate map in the memory, wherein the chosen phase candidate map comprises the set of voxels;
  select a chosen phase map value for at least a portion of the set of boundary voxels in the chosen phase map from the two phase candidate maps, wherein the phase map value is chosen by comparing the candidate phase map value for each of the set of boundary voxels in each of the two phase candidate maps selecting the candidate phase map value which indicates the lowest fat to water ratio; and
  calculate the phase map value of the object voxels according to a phase candidate selection algorithm, wherein input for the phase candidate selection algorithm comprises the two phase candidate maps and the chosen phase map value for the at least a portion of the set of boundary voxels in the chosen phase map.

14. A method of operating a magnetic resonance imaging system acquire magnetic resonance data from a subject within an imaging zone, wherein the method comprises the steps of:
- controlling the magnetic resonance imaging system with pulse sequence data to acquire the magnetic resonance data, wherein the pulse sequence data comprises commands for acquiring the magnetic resonance data using an n point Dixon magnetic resonance imaging method, wherein n is greater than or equal to two;
- constructing two phase candidate maps using the magnetic resonance data according to the n point Dixon magnetic resonance imaging method, wherein each of the two phase candidate maps are in image space, wherein each of the two phase candidate maps comprise a set of voxels, and wherein each voxel has a phase map value;
- identifying a set of object voxels in the set of voxels using an object identification algorithm;
- identifying a set of boundary voxels and a set of interior voxels within the set of object voxels using a boundary identification algorithm;
- creating chosen phase candidate map, wherein the chosen phase candidate map comprises the set of voxels;
- selecting a chosen phase map value for at least a portion of the set of boundary voxels in the chosen phase map from the two phase candidate maps, wherein the phase map value is chosen by comparing the candidate phase map value for each of the set of boundary voxels in each of the two phase candidate maps selecting the candidate phase map value which indicates the lowest fat to water ratio; and
- calculating the phase map value of the object voxels according to a phase candidate selection algorithm, wherein input for the phase candidate selection algorithm comprises the two phase candidate maps and the chosen phase map value for the at least a portion of the set of boundary voxels in the chosen phase map.

* * * * *